(12) United States Patent
Ono

(10) Patent No.: US 6,335,643 B1
(45) Date of Patent: Jan. 1, 2002

(54) DRIVER CIRCUIT

(75) Inventor: Akihiko Ono, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/773,001

(22) Filed: Jan. 31, 2001

(30) Foreign Application Priority Data

Jul. 19, 2000 (JP) ............................................ 12-219195

(51) Int. Cl.[7] ................................................. H03K 3/00
(52) U.S. Cl. ...................................... 327/108; 327/110
(58) Field of Search ................................ 327/110, 108, 327/111, 112, 423, 424, 588, 427

(56) References Cited

U.S. PATENT DOCUMENTS 5,638,012 A * 6/1997 Hashimoto et al. ......... 327/110
5,880,626 A * 3/1999 Dean ........................... 327/110
6,246,269 B1 * 6/2001 Schuler et al. ............... 327/110

* cited by examiner

Primary Examiner—Toan Tran
(74) Attorney, Agent, or Firm—Arent, Fox, Kintner, Plotkin & Kahn, PLLC

(57) ABSTRACT

A driver circuit is disclosed, capable of performing a stable damping operation with a simple circuit configuration without the need of external regulation and without being influenced by specification changes and variations in load and driver current IO, wherein, in a damping circuit, a diode-connected transistor and a damping current limiting resistor are connected between an NPN transistor with the base thereof controlled by a damping circuit control signal and an output terminal, likewise, in a damping control circuit, the resistance ratio of ON resistance of a PMOS transistor and a resistor relative to ON resistance of a PMOS transistor and a load resistor is set to m times, and a current ratio of a first bias current relative to a driver constant current circuit is set to (1/N) times, and a relation between a damping control signal and a low potential-side voltage at the output terminal is set to $\Delta Vdo=((m/N)-1) \times RDRV \times IO < Vbe\,7 + Vbe\,8$, thereby preventing a damping malfunction.

18 Claims, 10 Drawing Sheets

BLOCK DIAGRAM OF A DRIVER CIRCUIT HAVING A DAMPING CIRCUIT ACCORDING TO A CONVENTIONAL TECHNIQUE

BLOCK DIAGRAM OF A DRIVER CIRCUIT HAVING A DAMPING CIRCUIT ACCORDING TO ANOTHER CONVENTIONAL TECHNIQUE

FIG. 3 CONCRETE CIRCUIT EXAMPLE RELATED TO THE DRIVER CIRCUITS HAVING THE DAMPING CIRCUIT IN THE CONVENTIONAL TECHNIQUES DIRECTED TO FIGS.1 AND 2

OPERATING WAVEFORM DIAGRAM IN DRIVER CIRCUIT OPERATION RELATED TO THE CONVENTIONAL TECHNIQUES DIRECTED TO FIGS.1 AND 2

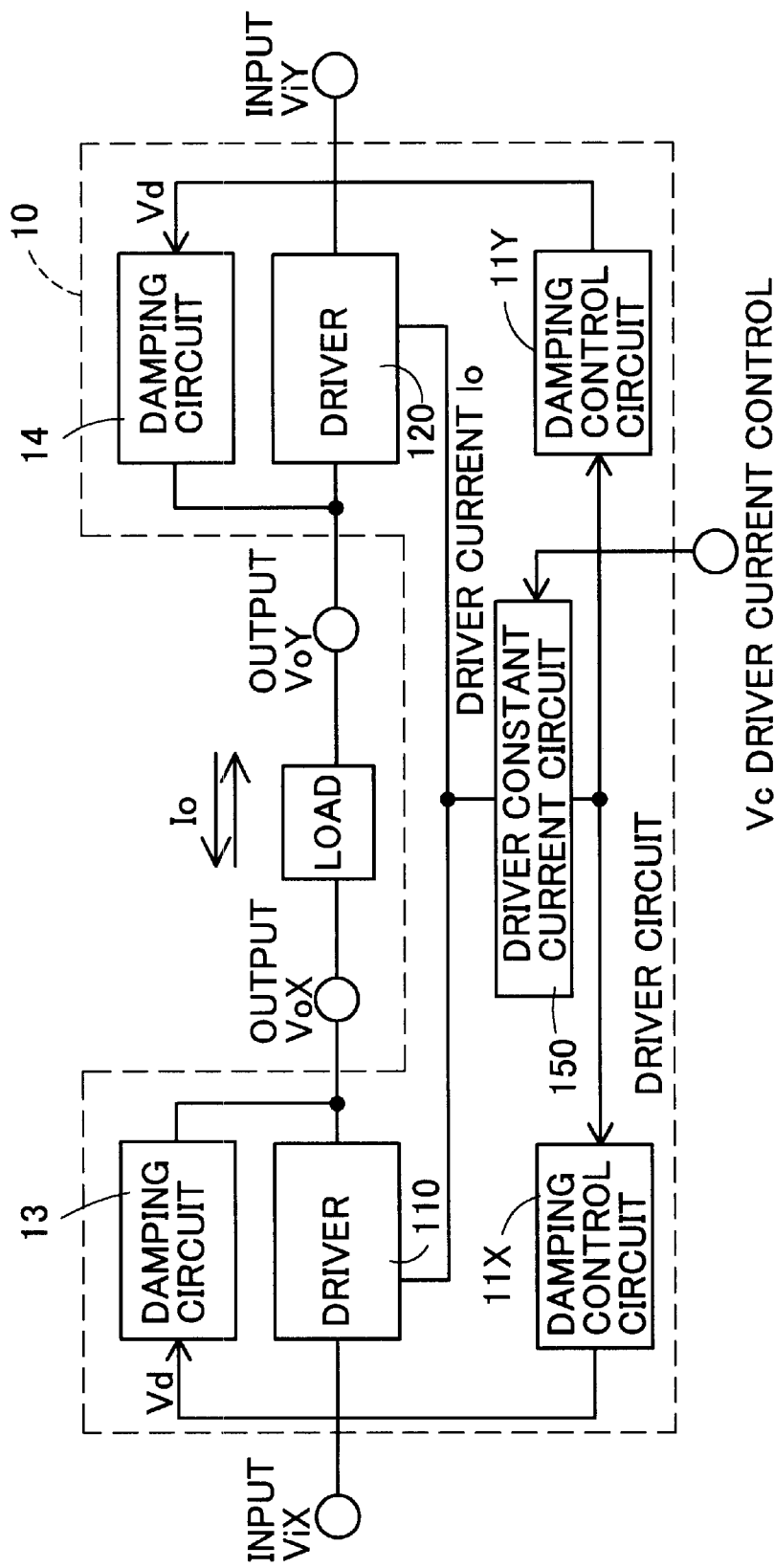
FIG. 5  BLOCK DIAGRAM OF A DRIVER CIRCUIT HAVING A DAMPING CIRCUIT ACCORDING TO THE FIRST EMBODIMENT OF THE PRESENT INVENTION

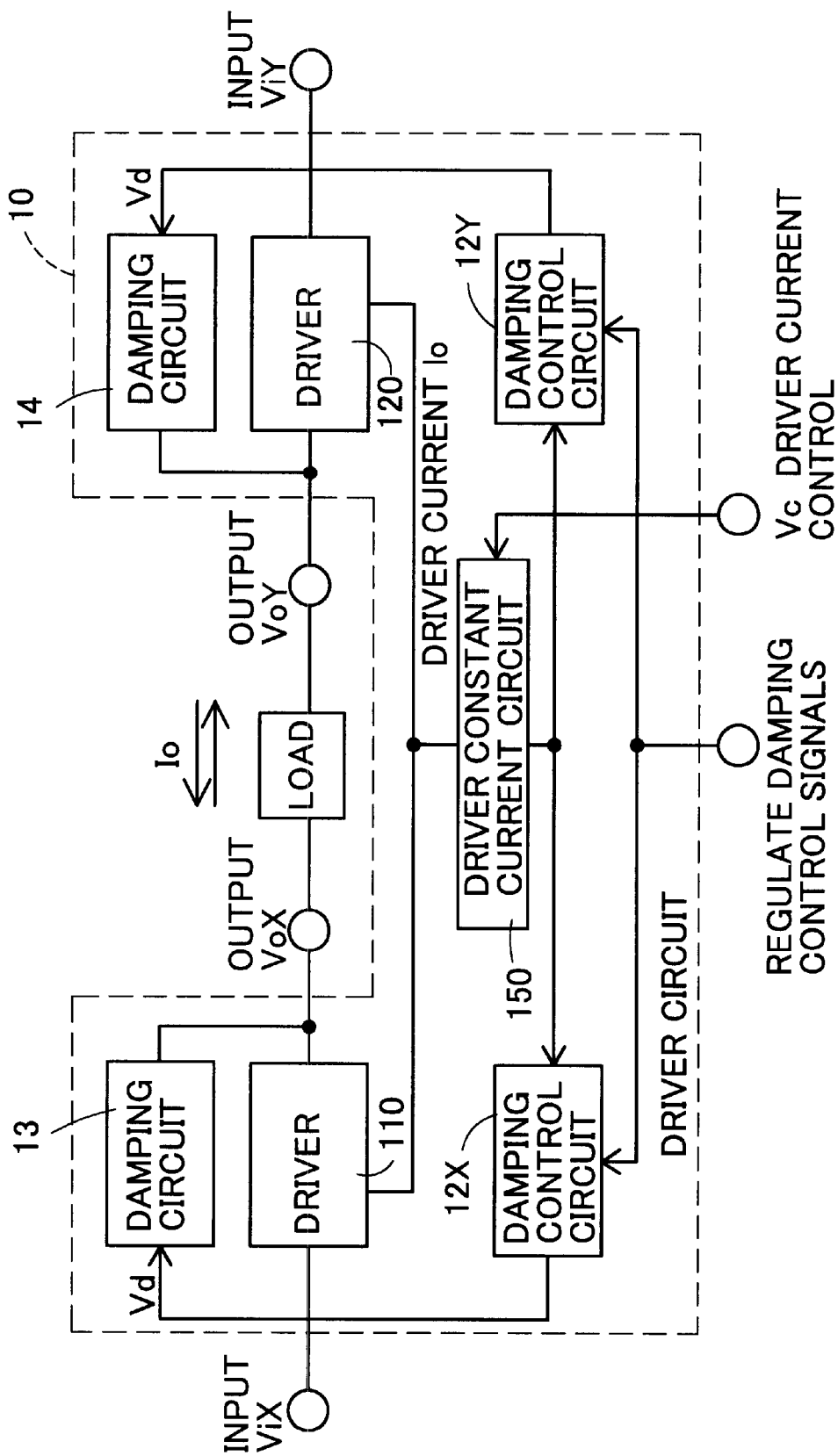
FIG. 6  BLOCK DIAGRAM OF A DRIVER CIRCUIT HAVING A DAMPING CIRCUIT ACCORDING TO THE SECOND EMBODIMENT OF THE PRESENT INVENTION

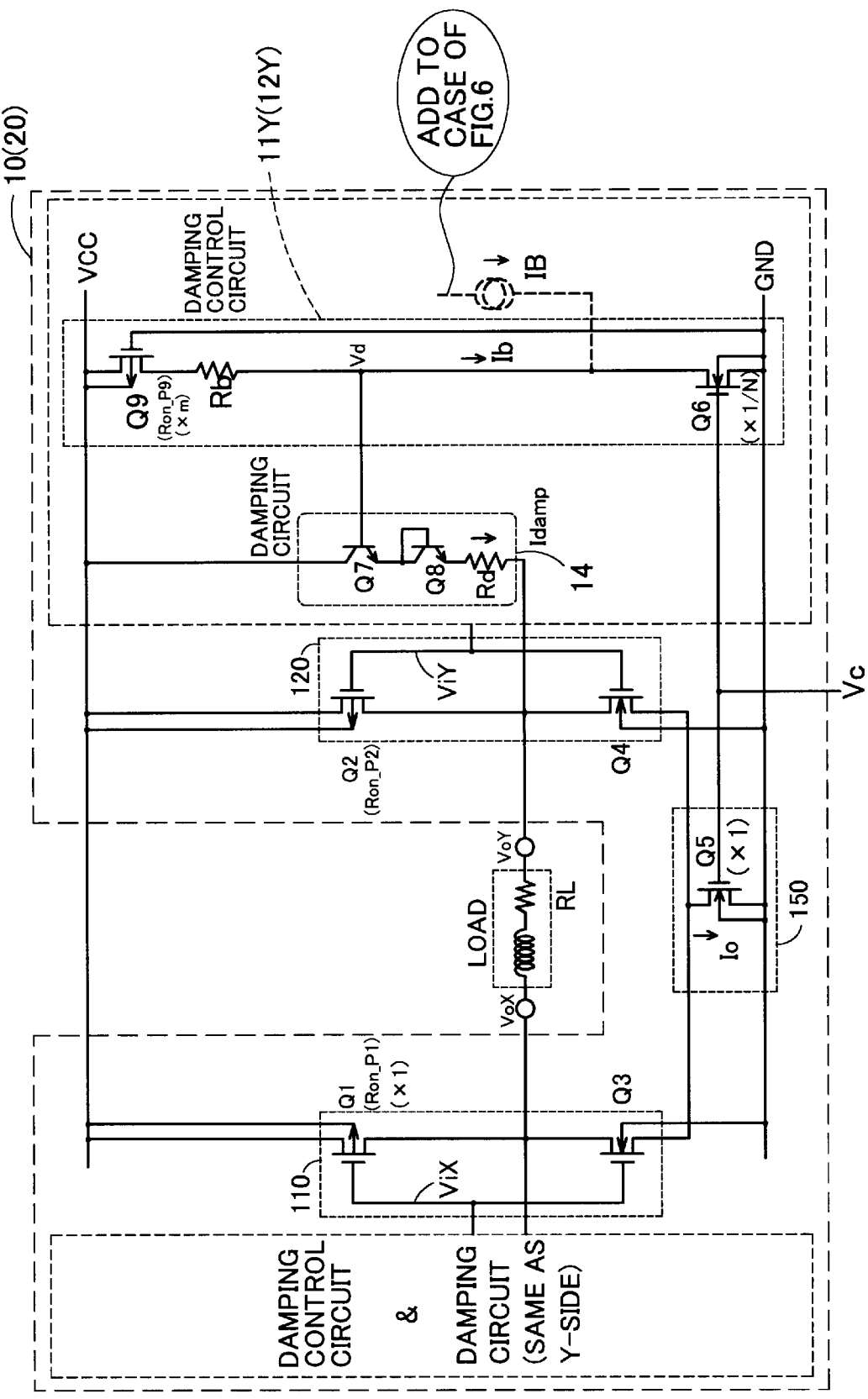

CHARACTERISTIC DIAGRAM OF OUTPUT TERMINAL VOLTAGE AND DAMPING VOLTAGE RELATIVE TO AN OUTPUT CURRENT

OPERATING WAVEFORM DIAGRAM OF THE DRIVER CIRCUITS
ACCORDING TO THE FIRST AND SECOND EMBODIMENTS

ANOTER CONCRETE CIRCUIT EXAMPLE RELATED TO DRIVER CIRCUITS

DRIVER CIRCUIT

BACKGROUND OF THE INVENTION

1. Field of the Invention

The present invention relates to controlling the waveform of a current driver. Particularly, the invention is concerned with a high-speed current driver circuit typical of which is a coil driver for write such as an HDD device.

2. Description of Related Art

In a current driver circuit used for driving a data write coil such as an HDD device, a so-called fly-back voltage is developed by a counter-electromotive force acting on an inductive load, etc. at the time of switching with a driver circuit, which is attributable to an inductive load on a data write coil as a load or inductive load components distributed on drive lines reaching the load, and ringing of a current waveform involving overshoot or undershoot occurs in a driver current. A damping circuit has heretofore been used to suppress such ringing waveform.

FIG. 1 is a block diagram of an output circuit provided with a damping circuit according to a prior art. In a driver circuit 100, a LOAD is connected in a sandwiched fashion between a driver terminal VoX of a driver 110 and an output terminal VoY of a driver 120, and flowing directions of a driver current IO outputted from a driver constant current circuit 150 are switched over from one to the other with complementary input signals inputted from input terminals ViX and ViY, thereby permitting the driver current IO to flow in both directions for the LOAD. Damping circuits 130 and 140 are connected to the output terminals VoX and VoY, respectively, to suppress a ringing waveform of the driver current IO.

FIG. 2 is a block diagram of a driver circuit provided with a damping circuit according to another prior art. In a driver circuit 200, like the driver circuit 100 in FIG. 1, a LOAD is connected in a sandwiched fashion between an output terminal VoX of a driver 110 and an output terminal VoY of a driver 120, and flowing directions of a driver current IO outputted from a driver constant current circuit 150 are switched over from one to the other with complementary input signals provided from input terminals ViX and ViY, allowing the driver current IO to flow in both directions. In this prior art, damping circuits 230 and 240 connected to the output terminals VoX and VoY respectively are each controlled by an externally provided damping control signal Vd, and a current ringing waveform is suppressed with a damping control signal Vd regulated in accordance with the driver current IO, the LOAD and resistive components distributed on drive lines reaching the LOAD, the driver current IO being regulated by an external output current control terminal Vc.

A concrete circuit example of FIGS. 1 and 2 is shown in FIG. 3, in which drivers 110, 120, a driver constant current circuit 150, and a connected LOAD are common to both FIGS. 1 and 2. In the driver 110, a pair of PMOS transistor Q1 and NMOS transistor Q3 are connected together in an inverter fashion to afford a half bridge configuration, and an inverted signal for an input signal from an input terminal ViX is outputted to an output terminal VoX. Likewise, in the driver 120, a pair of PMOS transistor Q2 and NMOS transistor Q4 are connected together in an inverter fashion to afford a half bridge configuration, and an inverted signal for an input signal from an input terminal ViY is outputted to an output terminal VoY. Further, the LOAD is connected to both output terminals VoX and VoY to afford an H bridge configuration, thereby driving the LOAD in both directions.

The driver constant current circuit 150, which determines the driver current IO, is a constant current circuit constituted of an NMOS transistor Q5 and supplies the driver current IO to the sources of the NMOS transistors Q3 and Q4 which constitute the H bridge.

Damping circuits (130 and 140 in FIG. 1, 230 and 240 in FIG. 2) are connected between a supply voltage VCC and the output terminals VoX, VoY. Although only the output terminal VoY side is described in FIG. 3, its configuration is also true of the output terminal VoX side, so an explanation of the VoX side will be omitted below.

In the prior art of FIG. 1, diode-connected NPN transistors Q7, Q8 and resistor Rd are connected in series between the supply voltage VCC and the output terminal VoY. When a fly-back voltage is developed by switching operations of the drivers 110 and 120 and a fall of potential from the supply voltage VCC to the output terminal VoY exceeds an amount corresponding to two forward voltages of the diode-connected transistors Q7 and Q8, a damping circuit 140 operates and supplies a damping current Idamp toward the output terminal VoY to perform a damping operation. If the number of diodes connected is increased from two to more, a damping operation start voltage can be set in accordance with the increased number of diodes.

In another prior art illustrated in FIG. 2, the base of the transistor Q7 out of the NPN transistors Q7 and Q8 is controlled with a damping control signal Vd. According to this configuration, the same damping operation as in FIG. 1 is performed, provided the voltage at the output terminal VoY which starts the damping operation is regulated in accordance with the damping control signal Vd. To be more specific, when the voltage at the output terminal VoY has dropped an amount corresponding to two forward voltages of the diodes from the damping control signal Vd, the damping circuit 140 is operated to perform a damping operation.

However, in the prior art illustrated in FIG. 1, the voltage at the output terminal VoY which starts the damping operation is fixed to a fall of potential which is set in the damping circuit 140. The fall voltage becomes a voltage of a fixed value after circuit determination although an appropriate number of diodes to be series-connected can be selected in advance, and therefore it is necessary that optimal operating conditions be re-designed for each load specification and driver current IO. Particularly, in the case where a driver circuit is configured by an integrated circuit, a large amount of time and labor are required from the re-design up to fabrication, thus posing a problem. Even in the same load specification, since there is no means for regulating variations in load characteristics, etc., it is inevitably required to take large the operational margin of the driver circuit, thus making it impossible to make the most of the capability of the driver circuit. Here again is posed a problem.

Besides, if the above regulations are not properly conducted, there is a fear that the following various problems may occur. More particularly, if the damping operation is insufficient, an overshoot or undershoot of the current waveform becomes larger and the write operation to the HDD device cannot be done at high speed. In the worst case, an erroneous write may result. Conversely, in case of an excessive damping operation, other than loss of output current consumption, loss of damping current Idamp in rising increases. As a result, the rising speed of the current waveform is delayed. These are not desirable from the standpoint of circuit operation. FIG. 4 illustrates operating current waveforms of the driver circuits in the conventional configurations of FIGS. 1 and 2. As is seen from FIG. 4, since the damping operation is insufficient, in a switching timing of input signals at the input terminals ViX and ViY there occur a fly-back voltage at each of the output terminals VoX and VoY, with consequent occurrence of a ringing waveform in the driver current IO.

SUMMARY OF THE INVENTION

The present invention has been accomplished for solving the above-mentioned problems involved in the prior art techniques referred to above and it is an object of the invention to provide a driver circuit which, with a simple circuit configuration, can perform a stable damping operation without the need of regulating the damping start voltage from the exterior and without being influenced by specification changes of load and driver current IO or by variations between individual components.

In one aspect of the present invention, for achieving the above object, there is provided a current driver circuit having a damping circuit for waveform-shaping an output current at the time of driving a load connected to an output terminal with the output current, the driver circuit being provided with a damping control circuit which outputs a damping control signal to be inputted to the damping circuit to determine a damping operation start voltage at the output terminal, the damping control signal being varied in accordance with the output current and setting a potential difference between a normal operating voltage and the damping operation start voltage at the output terminal to a predetermined value.

In the above driver circuit, even if the normal operating voltage at the output terminal varies according to the output current, the damping control signal outputted from the damping control circuit makes control so that the damping circuit operates while a voltage which has varied a predetermined voltage value from the normal operating voltage at the output terminal is used as a damping operation start voltage.

Thus, it is not necessary to preset and design a damping operation start voltage or regulate it from the exterior in accordance with specifications of load and output current value, and the damping circuit can be operated always in an optimal state. Consequently, such inconveniences as ringing of the current waveform, delay of transition speed, and loss of current consumption, are prevented and a stable damping operation can be ensured without being influenced by specification changes and variations in load and output current.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 5 is a block diagram of a driver circuit having a damping circuit according to the first embodiment of the present invention;

FIG. 6 is a block diagram of a driver circuit having a damping circuit according to the second embodiment of the present invention;

FIG. 7 illustrates a concrete circuit example related to the driver circuits having the damping circuit of the first and second embodiments;

DETAILED DESCRIPTION OF THE PREFERRED EMBODIMENTS

Figure 1:
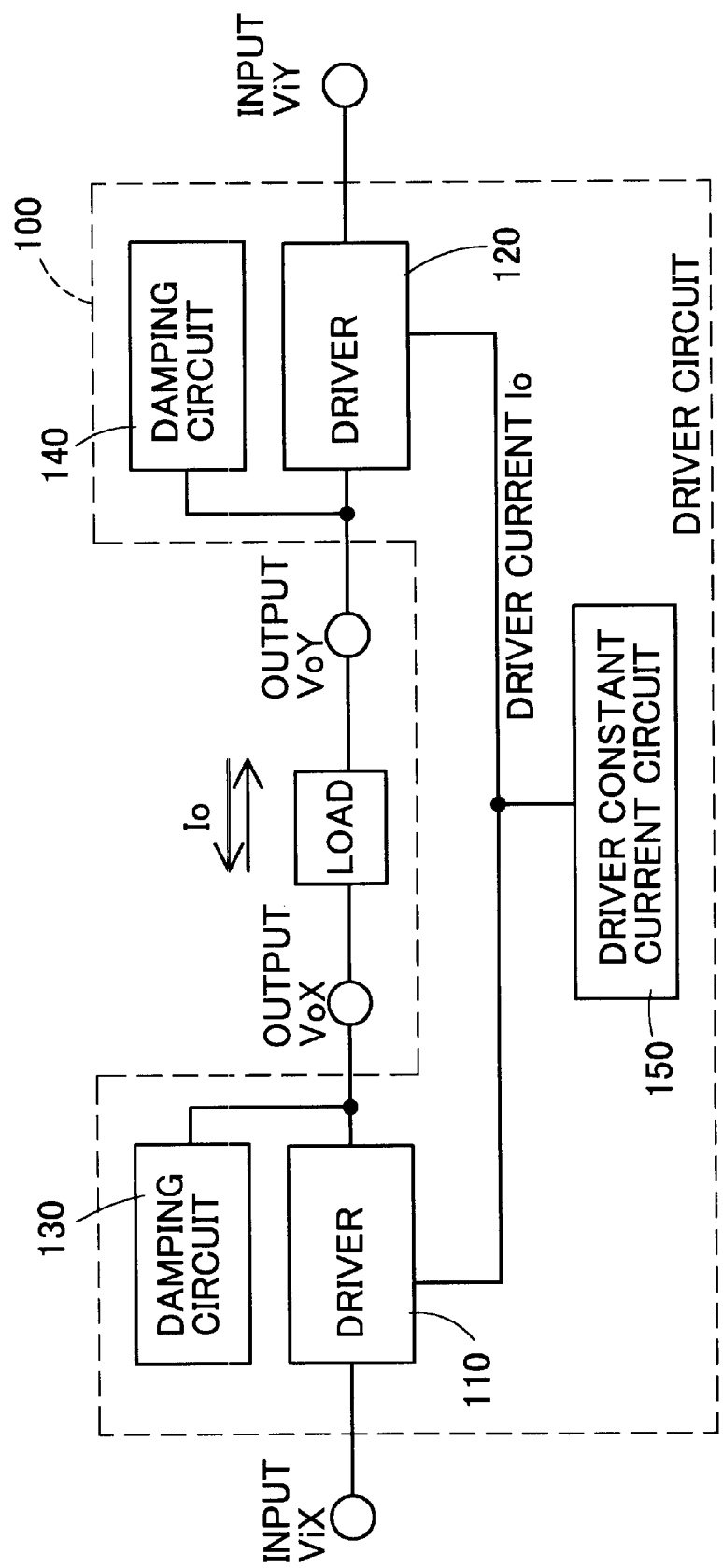
FIG. 1 is a block diagram of a driver circuit having a damping circuit according to a conventional technique.
Figure 2:
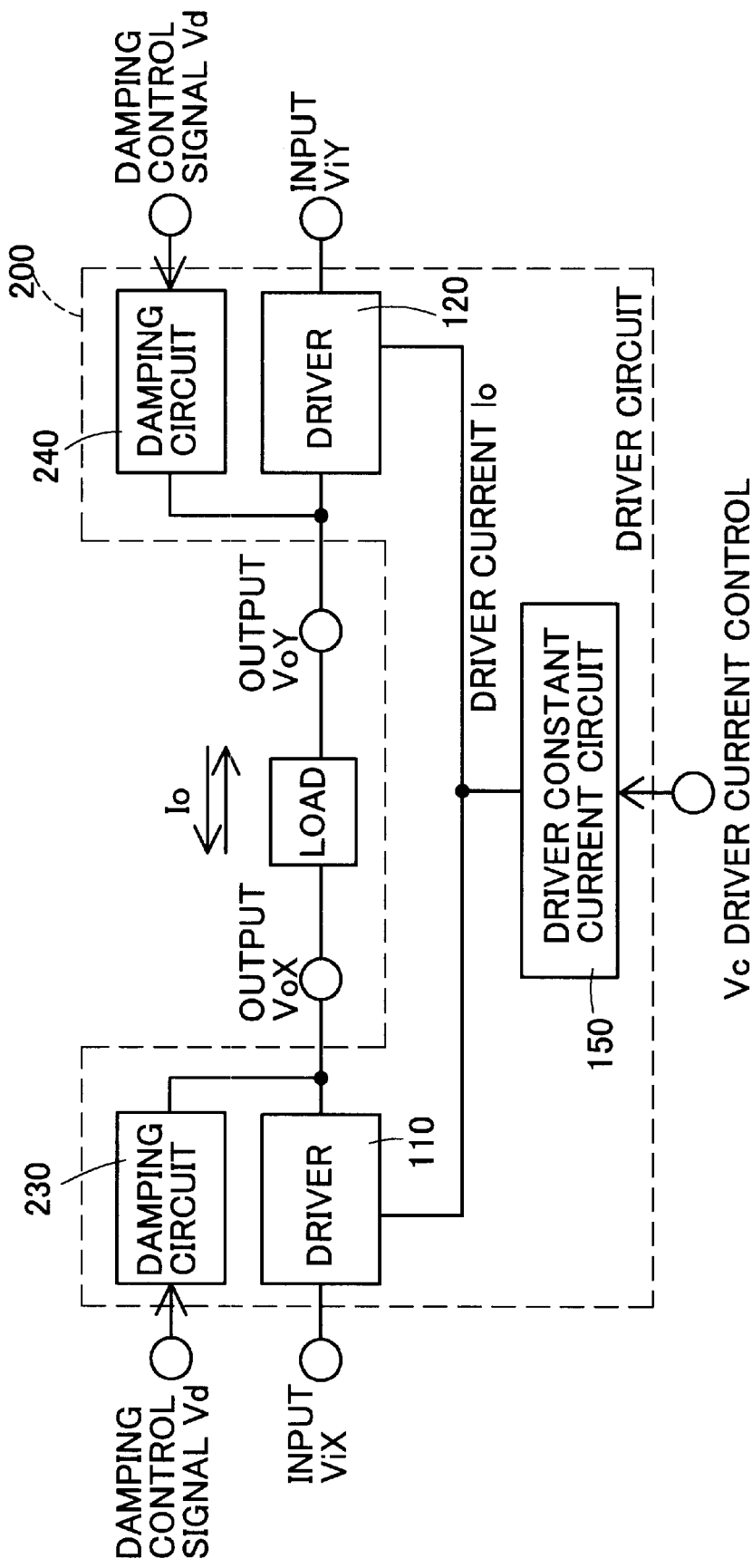
FIG. 2 is a block diagram of a driver circuit having a damping circuit according to another conventional technique.
Figure 3:
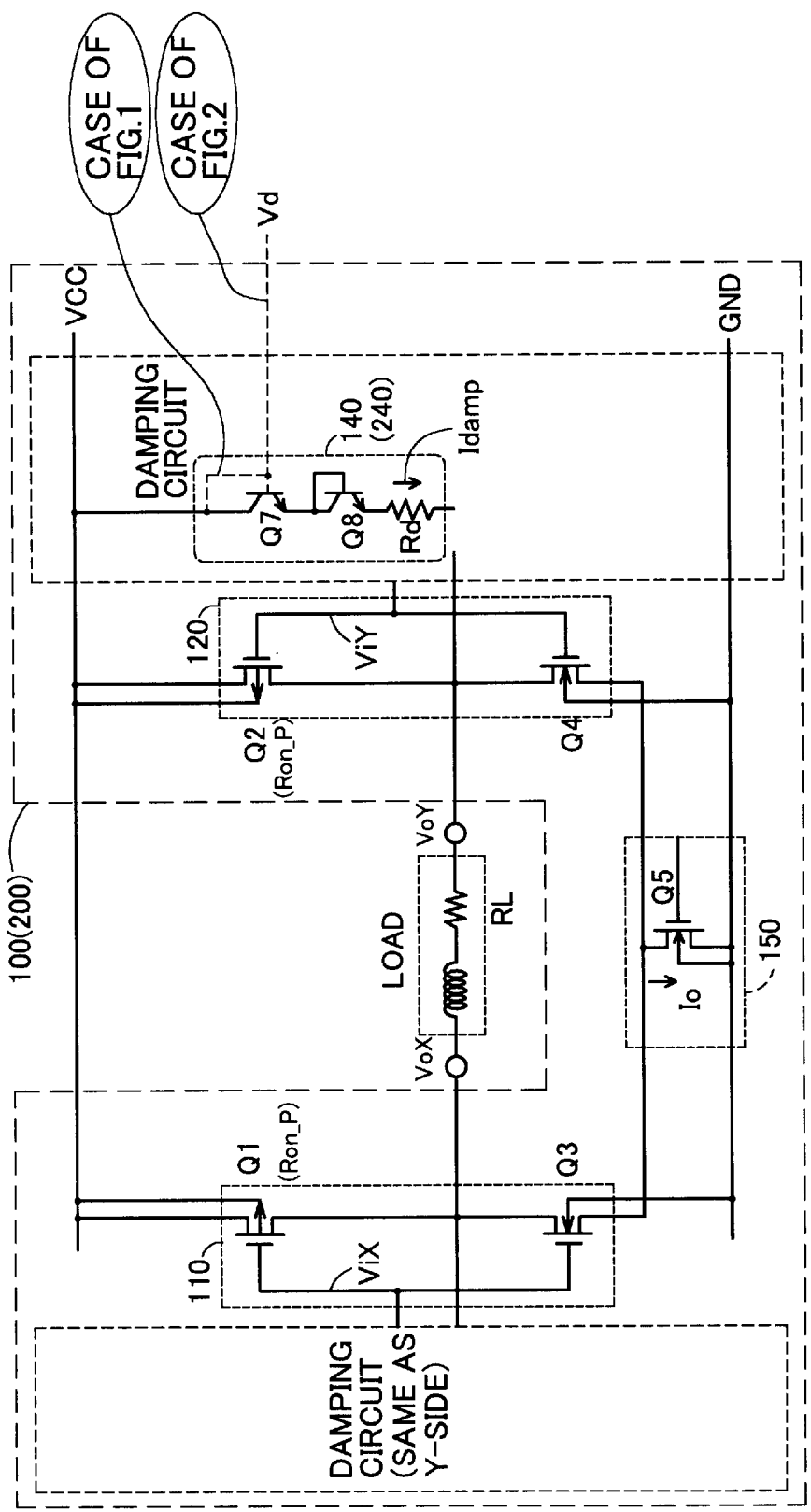
FIG. 3 illustrates a concrete circuit example related to the driver circuits having the damping circuit in the conventional techniques.
Figure 4:
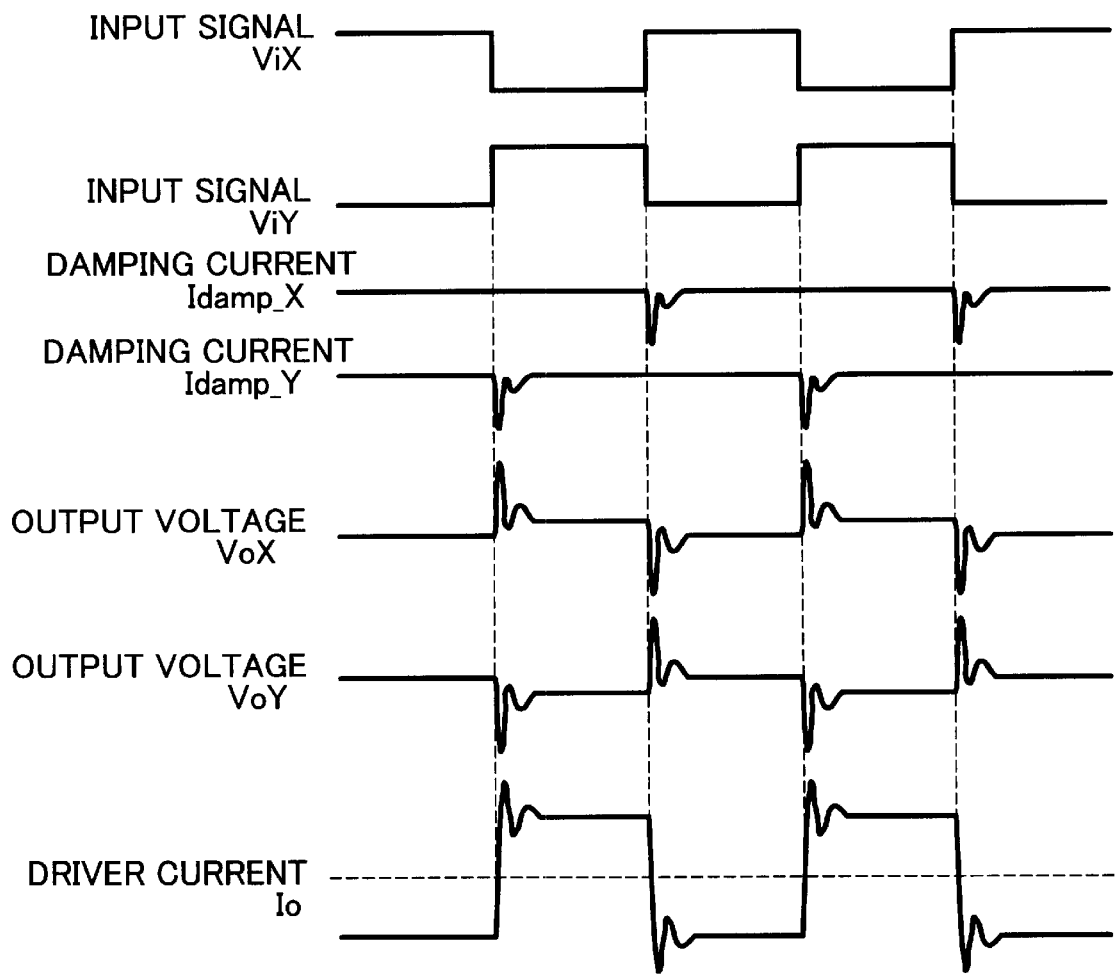
FIG. 4 is an operating waveform diagram in driver circuit operation related to the conventional techniques.
Figure 8A:
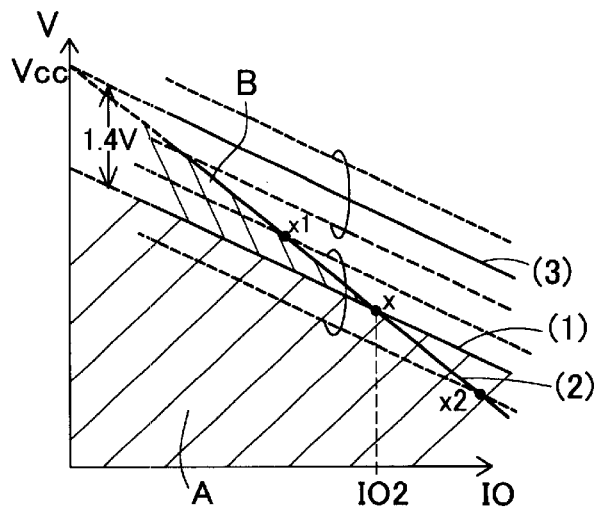
FIG. 8 is a characteristic diagram of output terminal voltage and damping voltage relative to an output current.
Figure 8B:
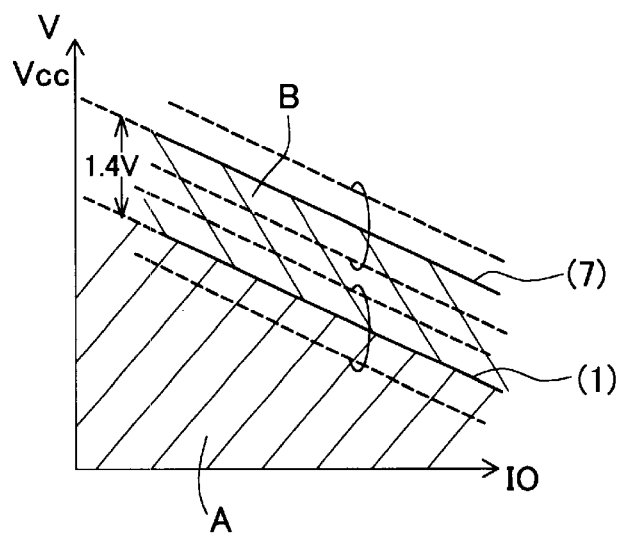
Figure 8C:
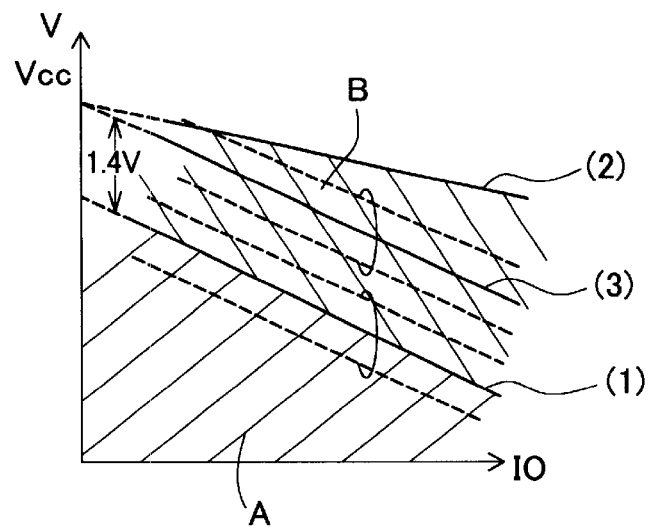
Figure 9:
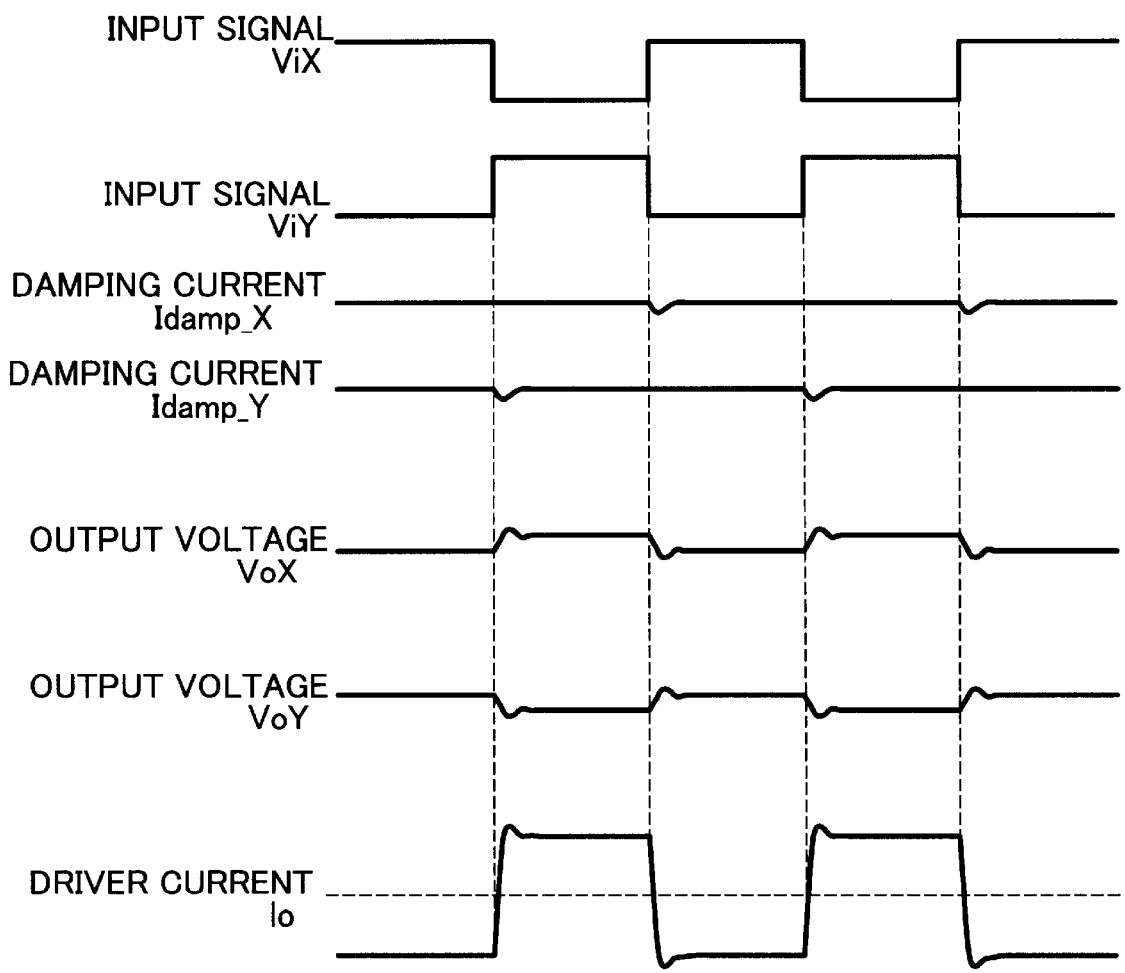
FIG. 9 is an operating waveform diagram of the driver circuits according to the first and second embodiments.
Figure 10:
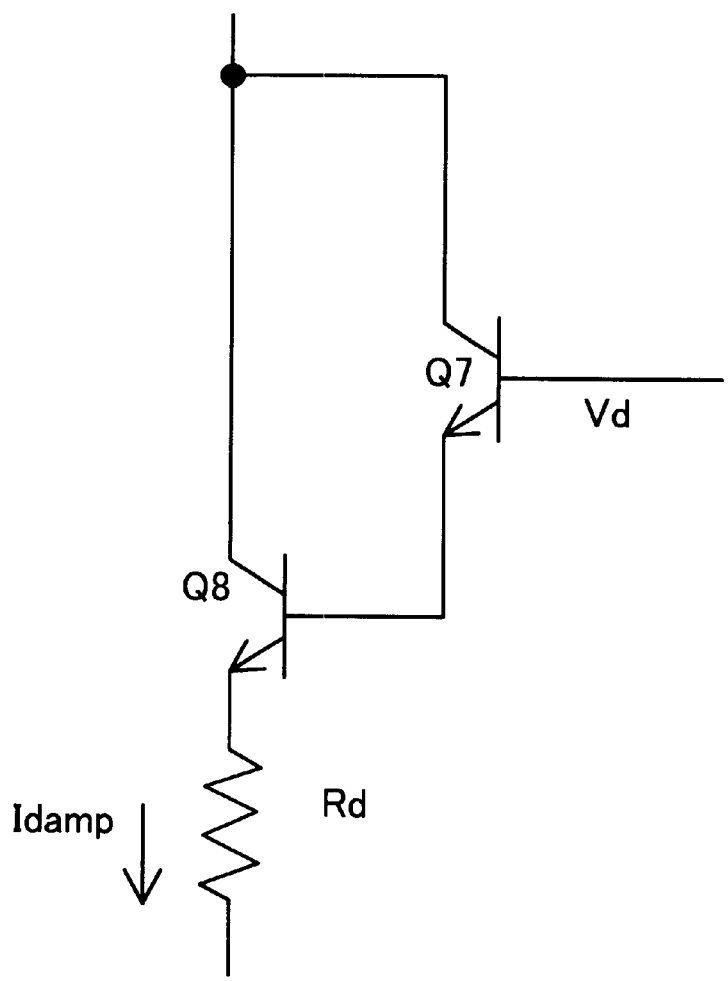
FIG. 10 illustrates another concrete circuit example related to the driver circuits of the first and second embodiments.

Driver circuits embodying the present invention will be described in detail hereinunder with reference to FIGS. 5 to 10, of which FIG. 5 is a block diagram of a driver circuit having a damping circuit according to the first embodiment of the present invention, FIG. 6 is a block diagram of a driver circuit having a damping circuit according to the second embodiment of the present invention, FIG. 7 illustrates a concrete circuit example related to the driver circuits having the damping circuit of the first and second embodiments, FIG. 8 is a characteristic diagram of output terminal voltage and damping voltage relative to a driver current, FIG. 9 is an operating waveform diagram of the driver circuits according to the first and second embodiments, and FIG. 10 illustrates another concrete circuit example related to the driver circuits of the first and second embodiments.

As to the following function, a driver circuit 10 according to the first embodiment shown in FIG. 5 has the same configuration as that of the prior art; that is, a LOAD is connected in a sandwiched fashion between an output terminal VoX of a driver 110 and an output terminal VoY of a driver 120, flowing directions of a driver current IO outputted from a driver constant current circuit 150 are switched over from one to the other with complementary input signals inputted from input terminals ViX and ViY, allowing the driver current IO to flow in both directions for the LOAD. Damping circuits 13 and 14 for preventing the occurrence of a ringing waveform of the driver current IO are connected to output terminals VoX and VoY, respectively. In the damping circuits 13 and 14, a damping start voltage is controlled by a damping control signal Vd outputted from the damping control circuits 11X and 11Y in accordance with a first bias current Ib (see FIG. 7) which has a predetermined current ratio relative to a driver current IO produced in the damping control circuits 11X and 11Y. The damping control signal Vd maintains a predetermined relation to a normal operating voltage at the output terminals VoX and VoY. The driver current IO is regulated and varied from the exterior by an output current control terminal Vc as in the prior art, but even if it is varied, the relation between the damping control signal Vd and the normal operating voltage at the output terminals VoX and VoY is controlled so as to maintain the predetermined relation by the damping control circuit 11X and 11Y and it is possible to ensure a sufficient operational margin for the damping start voltage.

In a driver circuit 20 according to the second embodiment of the present invention, as to a driver constant current circuit 150, drivers 110 and 120 which drive a LOAD with a driver current IO outputted from a driver constant current circuit 150, the circuit 150 being regulated and varied by an output current control terminal Vc, damping circuits 13 and 14 which are connected to output terminals VoX and VoY respectively and which are controlled their damping start voltage with a damping control signal Vd outputted from damping control circuits 12X and 12Y, and response of a bidirectional driver current IO from the output terminals VoX and VoY relative to complementary input signals provided from input terminals ViX and ViY, these are the same as in FIG. 5. In the damping control circuits 12X and 12Y shown in FIG. 6, a damping signal regulating terminal is provided in addition to the function of the damping control circuits 11X and 11Y shown in FIG. 5. The damping control signal Vd can be regulated by inputting a second bias current IB from that terminal to increase or decrease a first bias current Ib.

It is a circuit example of FIG. 7 that embodies the circuit blocks of the first and second embodiments (FIGS. 5 and 6 respectively). Since damping circuits used in this circuit example are of the same configuration and operation for both output terminals VoX and VoY, only the output terminal VoY side will be explained below and an explanation about the configuration of the output terminal VoX side will be omitted.

Drivers 110, 120, a driver constant current circuit 150, and a connected LOAD are of configurations common to all of the first and second embodiments and the prior art.

The driver 110 comprises a pair of PMOS transistor Q1 and NMOS transistor Q3 which are connected together in an inverter configuration to afford a half bridge configuration, and an inverted signal for an input signal fed from an input terminal ViX is outputted to an output terminal VoX. Likewise, in the driver 120, a pair of PMOS transistor Q2 and NMOS transistor Q4 are connected together in an inverter configuration to afford a half bridge configuration, and an inverted signal for an input signal from an input terminal ViY is outputted to an output terminal VoY. Further, a LOAD is connected between both output terminals VoX and VoY to form an H bridge configuration, whereby the LOAD is driven in both directions. The driver constant current circuit 150 which determines a driver current IO is a constant current circuit constituted of an NMOS transistor Q5 and supplies the driver current IO to the NMOS transistors Q3 and Q4 which constitute the H bridge.

Also as to the damping circuit 14, it is common to both first and second embodiments. The collector of an NPN transistor Q7, whose base is controlled with a damping circuit control signal Vd, is connected to a supply voltage VCC and the emitter thereof is connected to the anode of a diode-connected NPN transistor Q8. The cathode of the diode- connected transistor Q8 is linked to the output terminal VoY through a damping current limiting resistor Rd to constitute the damping circuit 14. If the voltage at the output terminal VoY drops from a voltage set by the damping circuit control signal Vd to a voltage level beyond a voltage which is the sum of a base-emitter forward voltage Vbe 7 of the NPN transistor Q7 and a forward voltage Vbe 8 of the diode-connected transistor Q8, the damping circuit 14 starts operating and supplies the output terminal VoY with a damping current Idamp defined by the damping current limiting resistor Rd in accordance with the voltage drop at the output terminal VoY. Given that Vbe 7=Vbe 8=0.7V, the voltage at the output terminal VoY which starts the operation of the damping circuit 14 is calculated as follows:

$$VO(damp) = Vd - (Vbe\ 7 + Vbe\ 8) = Vd - 1.4V \tag{1}$$

Thus, when the voltage at the output terminal VoY has dropped 1.4V or more in comparison with the voltage level of the damping circuit control signal Vd, the damping circuit 14 starts its damping operation.

The damping control circuit 11Y used in the first embodiment is of a configuration such that a PMOS transistor Q9 which is in an analogous relation to the PMOS transistor Q1 as a constituent of the driver 110 is connected at its source to the supply voltage VCC, the drain thereof is connected to the resistor Rb, and the gate thereof is connected to the ground potential, to constitute a damping controlling load circuit. ON resistance Ron_P9 and resistance Rb of the PMOS transistor Q9 are m times as high as ON resistance Ron_P1 and load resistance RL respectively of the PMOS transistor Q1. A damping controlling current source circuit is constituted of an NMOS transistor Q6 having a Miller current ratio of (1/N) times as high as an NMOS transistor Q5 which constitutes the driver constant current circuit 150, to configure a current Miller circuit. The drain of the NMOS transistor Q6 is connected to the resistor Rb in the damping controlling load circuit, allowing the first bias current Ib to flow in the same circuit. The voltage set for the damping control signal Vd depends on a voltage drop caused by the first bias current Ib flowing in the sum total of ON resistance Ron_P9 of the PMOS transistor Q9 and the resistance Rb, so that if Ron_P1+RL=RDRV, the voltage (VO) at which the output terminal VoY is on a low potential side in a normal operating state, and the set voltage of the damping control signal Vd become as follows:

$$\begin{aligned} VO &= VCC - (Ron\_P1 + RL) \times IO \\ &= VCC - RDRV \times IO \end{aligned} \tag{2}$$

$$\begin{aligned} Vd &= VCC - (Ron\_P9 + Rb) \times Ib \\ &= VCC - (m \times RDRV) \times ((1/N) \times IO) \\ &= VCC - (m/N) \times RDRV \times IO \end{aligned} \tag{3}$$

Thus, the voltage (ΔVdo) imposed on the damping circuit is:

$$\begin{aligned} \Delta Vdo &= Vd - VO \\ &= ((m/N) - 1) \times RDRV \times IO \end{aligned} \tag{4}$$

From both equations (1) and (4):

$$\Delta Vdo < 1.4V\ ((m/N) - 1) \times RDRV \times IO < 1.4V \tag{5}$$

Under this condition there no longer occurs any malfunction of the damping circuit. That is, with the driver current IO and resistive component RDRV on the current path, which satisfy the following relationship, there occurs no malfunction of the damping circuit:

$$RDRV \times IO < 1.4V / ((m/N) - 1) \tag{6}$$

If m is set equal to N, the equation (3) becomes as follows:

$$Vd = VCC - (N/N) \times RDRV \times IO \quad (7)$$
$$= VCC - RDRV \times IO$$
$$= VO$$

Thus, the set voltage of the damping control signal Vd coincides with the low potential-side voltage (VO) at the output terminal VoY. Consequently, in accordance with the equations (1) and (7), an operational margin from the low potential-side voltage (VO) at the output terminal VoY to the damping start voltage is always 1.4V.

It is FIG. 8 that shows the above voltage relations graphically. In the state shown in FIG. 8, the resistive component in the current path is fixed and the driver current IO is made variable. In the same figure, a straight line (2) indicates the low potential-side voltage at the output terminal VoY in the normal operating state and it is a graphic representation of the equation (2). A straight line (3) is a graphic representation of the equation (3), indicating the set voltage of the damping control signal Vd. Extrapolation of both straight lines to the zero point of the driver current IO results in crossing VCC plotted along the axis of ordinate. A straight line (1) is a graphic representation of the equation (1), indicating a damping start voltage at the output terminal VoY. As is apparent also from the equation (1), the straight line (1) is a 1.4V shifted line in the negative direction of the axis of ordinate from the line (3).

FIG. 8(A) shows a case of (m/N)<1 in which the inclination of the line (2) is steep relative to the line (3). The region A below the line (1) is a damping operation region. Upon transition of the terminal voltage at the output terminal VoY to the region A with a fly-back voltage for example, the damping circuit 14 performs its damping operation. Thus, as long as the line (2) is positioned above the region A, the damping circuit 14 will be free of any malfunction and a drive operation can be done with the driver current IO below a critical point X (driver current IO=IO2). The region B from the line (2) to the line (1) is a region of an operational margin until the start of a damping operation. In a small driver current IO region it is possible to make the operational margin large.

FIG. 8(B) shows a case of m=N, in which the voltage level of the damping control signal Vd and the low potential-side voltage (VO) at the output terminal VoY coincides with each other (a straight line (7) in FIG. 8(B)), as shown in the equation (7). Thus, the line (1) indicating a damping start voltage at the output terminal VoY is a 1.4V dropped line from the line (7) and the low potential-side voltage (VO) at the output terminal VoY is set with a margin of 1.4V from the damping start voltage unless there is no voltage limitation in the damping circuit 14. The region B from the line (7) to the line (1) is a region of an operational margin until the start of a damping operation, which operational margin can be made uniform in the whole region of the driver current IO.

FIG. 8(C) shows a case of (m/N)>1 in which the inclination of the straight line (3) is steep relative to the straight line (2). The region A below the straight line (1) is a damping operation region. Upon transition of the terminal voltage at the output terminal VoY to the region A by a fly-back voltage for example, the damping circuit 14 performs a damping operation. In this case, since the line (2) is positioned above the region A, there will be no malfunction of the damping circuit 14 and a drive operation can be done in the whole region of the driver current. The region B from the line (2) to the line (1) is a region of an operational margin until the start of a damping operation. The operational margin can be made large in a large driver current IO region.

Thus, by adjusting the critical point X of the output terminal VoY appropriately in the case of FIG. 8(A), or as long as there is no voltage limitation imposed on the damping circuit 14 in the case of FIGS. 8(B) and 8(C), the damping control circuit 11Y outputs a damping control signal Vd not causing a malfunction of the damping circuit 14 for any driver current IO, so it is not necessary to preset and design a damping operation start voltage in accordance with specifications of the LOAD and driver current IO nor is it necessary to make adjustment from the exterior. If only the m/N ratio is set beforehand to an optimal ratio on the basis of the relation between the driver waveform and the driver current IO in connection with the damping operation, it is possible to ensure operation always in an optimal state. Consequently, ringing of the current waveform, delay of the transition speed, and loss of the current consumption are sure to be prevented without being influenced by specification changes and variations in LOAD and driver current IO, thus ensuring a stable damping operation.

In the damping control circuit 12Y used in the second embodiment, the resistance ratio between the configuration of damping controlling load circuit comprising the PMOS transistor Q9 and the resistor Rb and the resistive component on the driver current path, as well as the current ratio between the configuration of the damping controlling current source circuit comprising the NMOS transistor Q5 and the NMOS transistor Q6 which constitutes a current Miller circuit and the driver current IO, are the same as in the damping control circuit 11Y and therefore the foregoing basic relationships (1) to (7) are also valid. In the second embodiment, the second bias current IB can be increased or decreased relative to the first bias current Ib with a damping control signal regulating terminal. Consequently, by converting Ib into Ib ±IB in the equation (3), a damping control signal Vd' is converted as follows:

$$Vd' = VCC - (Ron\_P9 + Rb) \times (Ib \pm IB) \quad (3')$$
$$= VCC - (m \times RDRV) \times ((1/N) \times IO \pm IB)$$
$$= Vd \pm (m \times RDRV) \times IB$$

That is, the voltage component of m×RDRV×IB is shifted for the damping control signal Vd in the first embodiment. As shown in FIG. 8, in the lines (3) and (1) it becomes possible to make regulation in the range of ±(m×RDRV)×IB. As a result, in the case of FIG. 8(A), the operational margin can be widened by shifting a malfunction-free critical point in the damping circuit 14 from X to X2 in a larger direction of the driver current IO. This is also the case with FIGS. 8(B) and 8(C).

Moreover, against specification changes, for example, of the LOAD after assembly of the driver circuit, the margin of the damping operation can be adjusted by regulating the damping control signal regulating terminal. Thus, it is possible to cope with specification changes of the LOAD, etc. flexibly.

Since there is such a damping operation margin as mentioned above, it is possible to effect the damping operation positively without deteriorating the current drivability, and even at the time of current switching in a high-speed operation, as shown in FIG. 9, it is possible to surely prevent the occurrence of a current ringing waveform containing overshoot or undershoot.

The damping circuit 14 is not limited to the one illustrated in FIG. 7, but may be of such a configuration of Darlington connection as shown in FIG. 10. In this case, the damping start voltage can be set at the same voltage as in the damping circuit 14 in FIG. 7, and because Darlington connection is used, the current capacity of the damping current Idamp can be made large and it is possible to provide a circuit configuration having a capability of thoroughly eliminating a current ringing waveform caused by a fly-back voltage.

Further, by connecting the gate of the PMOS transistor Q9 in the damping control circuits 11Y and 12Y used in the first and second embodiments respectively to the input signal ViX which is coupled to the gate of the PMOS transistor Q1, the PMOS transistor Q9 can be driven in synchronism with the PMOS transistor Q1 as a constituent of the driver 110. In this case, the PMOS transistor Q9 turns ON gradually with transition of the input signal ViX, so that until ON resistance Ron__P9 drops into a stable state, the drop voltage of the PMOS transistor Q9 is large and the damping control signal Vd is kept low. Therefore, the damping operation start voltage in the damping circuit 14 can be kept low and a high-speed transition of the driver current 10 can be ensured without damping malfunction at the time of waveform rising of the driver current IO. Besides, at a subsequent ringing of the current waveform involving overshoot or undershoot it is possible to make a highly accurate control for the damping operation start voltage because the damping control signal Vd becomes stable at a predetermined value.

In addition, for the resistor Rb in the damping control circuits 11Y and 12Y used in the first and second embodiments respectively, by constituting it with a MOS transistor and controlling the bias voltage to the gate of the transistor to afford a variable resistance, or by constituting it with plural resistor rows and switching over from one to another resistor row to be connected with use of switching devices or the like to afford a variable resistance, the resistance ratio to a load resistance RL can be regulated to a predetermined value positively according to a specification change or variations in the LOAD. The bias voltage to the gate of the MOS transistor may be set so that it can be inputted directly from the exterior or may be produced in the interior by a DA converter in response to bits input from the exterior. As the switching devices or the like for switching over the connection of resistor rows there may be used MOS transistors, whereby the resistor rows can be switched over from one to another in response to bit input for the exterior for example.

As set forth above, in the driver circuit 10 of the first embodiment, the collector of the NPN transistor Q7 whose base is controlled with the damping circuit control signal Vd is connected to the supply voltage VCC and the emitter thereof is connected to the anode of the diode-connected transistor Q8, the cathode of which is connected to the output terminal VoY through the damping current limiting resistor Rd, to constitute the damping circuit 14. When the voltage at the output terminal VoY drops beyond Vbe 7+Vbe 8 from the voltage of the damping circuit control signal Vd, the damping circuit 14 operates and supplies the output terminal VoY with a damping current Idamp which is defined by the damping current limiting resistor Rd. Given that Vbe 7=Vbe 8=0.7V, the operation start voltage of the damping circuit becomes VO (damp)=Vd−1.4V.

In the damping controlling load circuit configured in the damping control circuit 11Y, the source of the PMOS transistor Q9 is connected to the supply voltage, the drain thereof is connected to the resistor Rb, and the gate thereof is connected to the ground potential, further, the resistance ratio of ON resistance Ron__P9 of the PMOS transistor Q9 and resistor Rb to ON resistance Rpm__P1 of the PMOS transistor Q1 and load resistance RL in the driver 110 is set to m times as much, and in the damping controlling current source circuit, a current Miller configuration is obtained by the NMOS transistor Q6 with the first bias current Ib presenting a Miller current ratio to the driver constant current circuit 150 of (1/N) times, in which the first bias current Ib flows in the damping controlling load circuit, with creation of a damping control signal Vd. From the relation between the resistance ratio m and the current ratio (1/N) the voltage imposed on the damping circuit is in the following relation to the voltage (VO) at which the voltage level of the output terminal VoY becomes a low potential-side voltage in the normal operating state:

$$\Delta Vdo = Vd - VO$$
$$= ((m/N) - 1) \times RDRV \times IO$$

and also in view of the relation to the damping operation starting voltage, VO(damp)=Vd−1.4V it is possible to prevent malfunction of the damping circuit under the condition of:

$$\Delta Vdo < 1.4V$$

$$((m/N)-1) \times RDRV \times IO < 1.4V$$

If (m/N)<1 as in FIG. 8(A) and if the low potential-side voltage VO at the output terminal VoY is positioned above the region A, there occurs no malfunction of the damping circuit 14 and a drive operation can be done at a driver current IO below the critical point X (driver current IO=IO2). The region B from line (2) to line (1) is an operational margin until the start of a damping operation. By adjusting the critical point X of the output terminal VoY appropriately it is possible to output a damping control signal Vd not causing a malfunction of the damping circuit 14 for any driver current IO centered on a small driver current IO region. If the m/N ratio is set beforehand to an optimal value taking the relation between driver waveform and driver current IO in connection with the damping action without presetting and designing or externally regulating the damping operation start voltage in accordance with specifications of LOAD and driver current IO, it is possible to ensure operation always in an optimal state.

In the case of m=N in FIG. 8(B), the voltage level of the damping control signal Vd and the low potential-side voltage VO at the output terminal VoY are coincident with each other, so that the damping start voltage at the output terminal VoY always takes a value 1.4V dropped from VO. Consequently, the low potential-side voltage VO at the output terminal VoY is set with a margin of 1.4V from the damping start voltage unless a voltage limitation is imposed on the damping circuit 14, and a damping control signal Vd not causing a malfunction of the damping circuit 14 can be outputted for any driver current IO while ensuring a uniform operational margin throughout the whole driver current IO region. It follows that it is possible to effect operation always in an optimal state without presetting and designing or externally regulating the damping operation start voltage in accordance with specifications of LOAD and driver current IO.

In the case of (m/N)>1 in FIG. 8(C), since the low potential-side voltage at the output terminal VoY is positioned above the region A, there is no fear of malfunction of the damping circuit 14 and it is possible to perform a drive operation in the whole driver current IO region. Particularly, since a damping control signal Vd not causing a malfunction of the damping circuit 14 can be outputted for any driver current IO centered on a large driver current IO region, the operation can be done always in an optimal state if the m/N ratio is set beforehand to an optimal value taking the driver waveform—driver current IO relation into account with respect to the damping action without presetting and designing or externally regulating the damping operation start voltage in accordance with specifications of LOAD and driver current IO.

Therefore, the relation between the damping circuit control signal Vd in the damping circuit 14 and the output terminal VoY can be maintained at a predetermined relation irrespective of specifications of LOAD and output current IO and it is possible to effect operation always in an optimal state without the need of making a design modification or regulation from an external terminal for each specification, thus making it possible to realize a stable damping operation not influenced by a specification change or variations.

In connection with the resistive components in the driver current path, the resistive component based on ON resistance Ron_P1 of the PMOS transistor Q1 as the first switching device and the resistive component in the damping controlling load circuit having a predetermined resistance ratio m are constituted of ON resistance Ron_P9 of the PMOS transistor Q9 as the second switching element having the same configuration as the first switching element, so it is possible to set a predetermined resistance ratio m of the two with a high accuracy. Consequently, a predetermined voltage ratio m of a voltage drop caused by the first bias current Ib flowing in the PMOS transistor Q9 as the second switching device relative to a voltage drop caused by the driver current IO flowing through the PMOS transistor Q1 as the first switching device can be set with a high accuracy and hence it is possible to set the damping operation start voltage with a high accuracy.

Further, also as to the resistive component (load resistance RL) based on LOAD and wiring path, in addition to the resistive component based on ON resistance Ron_P1 of the PMOS transistor Q1 as the first switching device on the output current path, it is set at a predetermined resistance ratio m to the damping controlling load circuit and therefore a predetermined voltage ratio m of a voltage drop caused by the first bias current Ib to a voltage drop caused by the driver current IO can be set with a higher accuracy.

In addition, since the damping controlling current source circuit is of a current Miller configuration with the PMOS transistor Q6 wherein the first bias current Ib presents a Miller current ratio of (1/N) times relative to the driver constant current circuit 150, the current ratio between the first bias current Ib and the driver current IO can be set to a predetermined current ratio (1/N) with a high accuracy.

The damping control circuit 12Y in the second embodiment is provided with a damping control signal regulating terminal in addition to the configuration of the damping control circuit 11Y in the first embodiment, whereby the second bias current IB can be increased or decreased for the first bias current Ib, so that Ib±IB becomes a bias current in place of the first bias current Ib and the damping control signal Vd is converted to:

Vd'=Vd±(m×RDRV)×IB thus permitting adjustment in the range of m×RDRV×IB. Therefore, in the case of FIG. 8(A), by shifting the critical point free of malfunction of the damping circuit 14 from X to X2 to make adjustment in the direction of a larger driver current IO, it is made possible to widen the operational margin. Also in the case of FIGS. 8(B) and 8(C) it is possible to adjust the damping operation margin. The damping operation margin can be adjusted also for a change in specification of LOAD after assembly of the driver circuit. Thus, it is possible to cope with a change in specification of LOAD flexibly.

Accordingly, by regulating the second bias current IB according to the state on the current path, a change of the driver current IO, or variations between individual components, it is possible to regulate the bias current (Ib–IB) flowing in the damping controlling load circuit, and by changing a voltage drop to regulate the voltage set for the damping control signal Vd, it is possible to regulate the damping start voltage. Thus, for a modification of specification and variations between individual components it is possible to set an optimal operation point of damping operation more flexibly and in a simple and stable manner.

The damping circuit 14 may be configured in Darlington connection, whereby the current capacity of the damping current Idamp can be increased and it is possible to provide a circuit configuration having a capability of thoroughly eliminating a current ringing waveform caused by a fly-back voltage.

Further, by connecting the gate of the PMOS transistor Q9 to the input signal ViX which is connected to the gate of the PMOS transistor Q1, to attain a synchronous drive, the PMOS transistor Q9 presents a large voltage drop until ON resistance Ron_P9 drops and a stable state is reached, and the damping control signal Vd is kept low, so that the damping operation start voltage in the damping circuit 14 can be kept low and a high-speed transition of the driver current IO can be ensured without damping malfunction at the time of waveform rise of the driver current IO. Besides, in subsequent ringing of the current waveform involving overshoot or undershoot, the damping control signal becomes stable at a predetermined value and hence it is possible to effect a highly accurate control for the damping operation start voltage.

Additionally, by constituting the resistor Rb with a MOS transistor, thereby affording a resistor variable in response to bias voltage to the gate thereof, or by constituting it with plural resistor rows and switching over from one to another resistor row to be connected with use of a switch or the like, thereby affording a variable resistor, it is possible to adjust the resistance ratio thereof relative to the load resistor RL positively to a predetermined value. In this connection there may be adopted a configuration wherein the gate bias voltage of the MOS transistor is inputted directly from the exterior or is produced in the interior in response to bit input from the exterior with use of a DA converter. As the switch or the like for switching over the connection of resistor rows there may be used a MOS transistor, whereby the resistor rows can be switched over from one to another row in response to bit input from the exterior for example.

According to the above embodiment, ringing of the current waveform, delay of the transition speed, and loss of the current consumption are sure to be prevented without being influenced by specification changes or variations in LOAD and driver current IO and it is possible to realize a stable damping operation.

It goes without saying that the present invention is not limited to the above embodiment and that various improvements and modifications may be made within the scope not departing from the gist of the invention.

For example, although in the above embodiment the damping controlling load circuit is composed of both PMOS transistor Q9 and resistor Rb, this constitutes no limitation. The damping controlling load circuit may be constituted of the MOS transistor Q9 alone.

Likewise, although the damping circuit 14 is composed of NPN bipolar transistors Q7 and Q8, this constitutes no limitation, which transistors may be substituted by MOS transistors.

Although in the above embodiment there is illustrated configuration wherein the damping current Idamp is fed to the output terminal VoY against a current ringing waveform based on a negative fly-back voltage, this constitutes no limitation. There also may be adopted a configuration wherein, by reversing the transistor polarity in such circuits as driver constant current circuit, damping circuit, and damping control circuit, the damping current Idamp is extracted from the output terminal VoY against a current ringing waveform based on a positive fly-back voltage.

Further, although the above description of the embodiment is mainly concerned with the output terminal VoY, it goes without saying that the same configuration of circuit is obtained also for the output terminal VoX in view of the configuration of the drivers circuits 10 and 20.

In each driver circuit according to the present invention, even if the normal operating voltage at an output terminal changes according to an output current, the damping control signal outputted from the damping control circuit enables the damping circuit using a predetermined voltage variation from the output terminal voltage as a damping operation start voltage, so that it is not necessary to regulate the damping operation start voltage beforehand in conformity with specifications of load and output current, and it is possible to effect operation always in an optimal state. Thus, ringing of the current waveform, delay of the transition speed, and loss of the current consumption are sure to be prevented without being influenced by specification changes and variations in load and output current, making it possible to attain a stable damping operation.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A driver circuit of a current drive type comprising an output current source circuit for setting an output current, an output driver for driving, with the output current, a load connected to an output terminal, and a damping circuit connected to the output terminal and functioning to shape the waveform of the output current at the time of driving the load, characterized by further comprising:
   a damping control circuit, the damping control circuit outputting a damping control signal which is inputted to the damping circuit and which determines a damping operation start voltage at the output terminal, the damping control signal being varied in accordance with the output current and setting a predetermined potential difference between a normal operating voltage at the output terminal and the damping operation start voltage.

2. A driver circuit according to claim 1, wherein the damping control circuit comprises:
   a damping controlling current source circuit which outputs a first bias current presenting a predetermined value of a current ratio relative to the output current; and
   a damping controlling load circuit having a resistive component in a current path of the first bias current extending from a reference potential to the damping control signal which resistive component present a predetermined value of a resistance ratio relative to a resistive component in a path of the output current extending from the reference potential to the output terminal.

3. A driver circuit according to claim 2, wherein the output driver is a first switching device, and the damping controlling load circuit is constituted of a second switching device of the same configuration as the first switching device, and an ON resistance ratio of the second switching device relative to the first switching device is a predetermined resistance ratio.

4. A driver circuit according to claim 3, wherein the damping controlling load circuit is provided with a resistive component having the same resistance ratio as the ON resistance ratio relative to a resistive component of the load or the resistive component of the load plus a resistive component in the current path of the output current extending from the reference potential to the output terminal, exclusive of the output driver.

5. A driver circuit according to claim 2, wherein the damping controlling current source circuit constitutes a current Miller circuit between it and the output current source circuit.

6. A driver circuit according to claim 2, wherein the damping control circuit is provided with an input terminal for inputting a second bias current, the second bias current inputted through the input terminal being added to/subtracted from the first bias current.

7. A driver circuit according to claim 3, wherein a switching control terminal of the second switching device is connected to a switching control terminal of the first switching device.

8. A driver circuit according to claim 3, wherein the first switching device is a first PMOS transistor and the second switching device is a second PMOS transistor.

9. A driver circuit according to claim 3, wherein the first switching device is a first NMOS transistor and the second switching device is a second NMOS transistor.

10. A driver circuit according to claim 4, wherein the resistive component in the damping controlling load circuit is constituted of a MOS transistor to afford a resistor variable in response to bias voltage to a gate of the MOS transistor.

11. A driver circuit according to claim 4, wherein the damping controlling load circuit comprises resistive components network and one or more switching devices which select one or more optimal resistive components from the resistive components network to make the resistive component in the damping controlling load circuit.

12. A driver circuit according to claim 4 wherein the damping controlling load circuit comprises a plurality of resistor rows and switching devices which select and switch over from one to another resister row appropriately so as to make the resistive component in the damping controlling load circuit.

13. A driver circuit according to claim 10, wherein the bias voltage applied to the gate of the MOS transistor is directly inputted from the exterior.

14. A driver circuit according to claim 10, wherein the bias voltage applied to the gate of the MOS transistor is produced in response to bits input coming from the exterior.

15. A driver circuit according to claim 11, wherein the switching devices are constituted of MOS transistors.

16. A driver circuit according to claim 12, wherein the switching devices are constituted of MOS transistors.

17. A driver circuit according to claim 15, wherein the control signal sent to the gate of the MOS transistor is directly inputted from the exterior.

18. A driver circuit according to claim 16, wherein the control signal sent to the gate of the MOS transistor is directly inputted from the exterior.

* * * * *